(12) United States Patent
Shchegrov et al.

(10) Patent No.: US 11,698,251 B2
(45) Date of Patent: Jul. 11, 2023

(54) METHODS AND SYSTEMS FOR OVERLAY MEASUREMENT BASED ON SOFT X-RAY SCATTEROMETRY

(71) Applicant: KLA Corporation, Milpitas, CA (US)

(72) Inventors: Andrei V. Shchegrov, Los Gatos, CA (US); Nadav Gutman, Zichron Yaaqov (IL); Alexander Kuznetsov, Austin, TX (US); Antonio Arion Gellineau, Santa Clara, CA (US)

(73) Assignee: KLA Corporation, Milpitas, CA (US)

( * ) Notice: Subject to any disclaimer, the term of this patent is extended or adjusted under 35 U.S.C. 154(b) by 378 days.

(21) Appl. No.: 17/137,840

(22) Filed: Dec. 30, 2020

(65) Prior Publication Data

US 2021/0207956 A1 Jul. 8, 2021

Related U.S. Application Data

(60) Provisional application No. 62/958,089, filed on Jan. 7, 2020.

(51) Int. Cl.
*G01B 15/00* (2006.01)
*G03F 7/00* (2006.01)
(Continued)

(52) U.S. Cl.
CPC ............ *G01B 15/00* (2013.01); *G01B 15/02* (2013.01); *G03F 7/70516* (2013.01);
(Continued)

(58) Field of Classification Search
CPC .... G01B 15/00; G01B 15/02; G01B 2210/56; G03F 7/70516; G03F 7/70633;
(Continued)

(56) References Cited

U.S. PATENT DOCUMENTS 5,608,526 A 3/1997 Piwonka-Corle et al.
5,859,424 A 1/1999 Norton et al.
(Continued)

FOREIGN PATENT DOCUMENTS

| KR | 10-2018-0096741 A | 8/2018 |
|---|---|---|
| WO | 2016176502 A1 | 11/2016 |
| WO | 2019173171 A1 | 9/2019 |

OTHER PUBLICATIONS

Adel, Mike, et al., Diffraction Order Control in Overlay Metrology: A Review of the Roadmap Options, Proceedings vol. 6922, Metrology, Inspection, and Process Control for Microlithography XXII; 692202 (2008).

(Continued)

*Primary Examiner* — Mark R Gaworecki
(74) *Attorney, Agent, or Firm* — Joseph S. Spano; Spano Law Group

(57) ABSTRACT

Methods and systems for performing overlay and edge placement errors based on Soft X-Ray (SXR) scatterometry measurement data are presented herein. Short wavelength SXR radiation focused over a small illumination spot size enables measurement of design rule targets or in-die active device structures. In some embodiments, SXR scatterometry measurements are performed with SXR radiation having energy in a range from 10 to 5,000 electronvolts. As a result, measurements at SXR wavelengths permit target design at process design rules that closely represents actual device overlay. In some embodiments, SXR scatterometry measurements of overlay and shape parameters are performed simultaneously from the same metrology target to enable accurate measurement of Edge Placement Errors. In another aspect, overlay of aperiodic device structures is estimated based on SXR measurements of design rule targets by (Continued)

calibrating the SXR measurements to reference measurements of the actual device target.

22 Claims, 9 Drawing Sheets

(51) Int. Cl.
*H01L 21/66* (2006.01)
*G01B 15/02* (2006.01)
*H01L 21/027* (2006.01)
*H10B 10/00* (2023.01)

(52) U.S. Cl.
CPC .......... *G03F 7/70633* (2013.01); *H01L 22/12* (2013.01); *H01L 22/20* (2013.01); *G01B 2210/56* (2013.01); *H01L 21/0276* (2013.01); *H10B 10/12* (2023.02)

(58) Field of Classification Search
CPC ..... H01L 21/0276; H01L 22/12; H01L 22/20; H10B 10/12
See application file for complete search history.

(56) References Cited

U.S. PATENT DOCUMENTS

| | | | |
|---|---|---|---|
| 6,429,943 B1 | 8/2002 | Opsal et al. |
| 6,633,831 B2 | 10/2003 | Nikoonahad et al. |
| 6,734,967 B1 | 5/2004 | Piwonka-Corle et al. |
| 6,816,570 B2 | 10/2004 | Janik et al. |
| 6,895,075 B2 | 5/2005 | Yokhin et al. |
| 6,972,852 B2 | 12/2005 | Opsal et al. |
| 7,478,019 B2 | 1/2009 | Zangooie et al. |
| 7,755,764 B2 | 7/2010 | Kwak et al. |
| 7,826,071 B2 | 11/2010 | Shchegrov et al. |
| 7,907,264 B1 | 3/2011 | Krishnan |
| 7,929,667 B1 | 4/2011 | Zhuang et al. |
| 7,933,026 B2 | 4/2011 | Opsal et al. |
| 8,749,179 B2 | 6/2014 | Liu et al. |
| 8,860,937 B1 | 10/2014 | Dziura et al. |
| 8,879,073 B2 | 11/2014 | Madsen et al. |
| 8,941,336 B1 | 1/2015 | Liu et al. |
| 9,710,728 B2 | 7/2017 | Pandev et al. |
| 9,875,946 B2 | 1/2018 | Shchegrov et al. |
| 9,915,522 B1 | 3/2018 | Jiang et al. |
| 10,041,873 B2 | 8/2018 | Krishnan |
| 10,139,352 B2 | 11/2018 | Pandev et al. |
| 10,145,674 B2 | 12/2018 | Krishnan |
| 10,151,986 B2 | 12/2018 | Shchegrov et al. |
| 10,152,678 B2 | 12/2018 | Pandev et al. |
| 10,281,263 B2 | 5/2019 | Krishnan |
| 10,352,876 B2 | 7/2019 | Shchegrov et al. |
| 10,473,460 B2 | 11/2019 | Gutman et al. |
| 2004/0169861 A1 | 9/2004 | Mieher et al. |
| 2012/0242970 A1 | 9/2012 | Smilde et al. |
| 2013/0114085 A1 | 5/2013 | Wang et al. |
| 2013/0304424 A1 | 11/2013 | Bakeman et al. |
| 2014/0019097 A1 | 1/2014 | Bakeman et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0246607 A1 | 9/2014 | Bykanov et al. |
| 2014/0297211 A1 | 10/2014 | Pandev et al. |
| 2014/0306115 A1 | 10/2014 | Kuritsyn et al. |
| 2014/0316730 A1 | 10/2014 | Shchegrov et al. |
| 2015/0008335 A1 | 1/2015 | Bykanov et al. |
| 2015/0042984 A1 | 2/2015 | Pandev et al. |
| 2015/0046118 A1 | 2/2015 | Pandev et al. |
| 2015/0076359 A1 | 3/2015 | Bykanov et al. |
| 2015/0110249 A1 | 4/2015 | Bakeman et al. |
| 2015/0117610 A1 | 4/2015 | Veldman et al. |
| 2015/0199463 A1 | 7/2015 | Tloreta et al. |
| 2015/0204664 A1 | 7/2015 | Bringoltz et al. |
| 2015/0300965 A1 | 10/2015 | Sezginer |
| 2016/0003609 A1 | 1/2016 | Shchegrov et al. |
| 2016/0128171 A1 | 5/2016 | Kuritsyn et al. |
| 2016/0202193 A1 | 7/2016 | Hench et al. |
| 2016/0216197 A1 | 7/2016 | Bringoltz et al. |
| 2016/0249442 A1 | 8/2016 | Kuritsyn et al. |
| 2016/0320319 A1 | 11/2016 | Hench et al. |
| 2017/0167862 A1 | 6/2017 | Dziura et al. |
| 2017/0357155 A1 | 12/2017 | Quintanilha et al. |
| 2018/0059019 A1 | 3/2018 | Houssam et al. |
| 2018/0106735 A1 | 4/2018 | Gellineau et al. |
| 2018/0350699 A1 | 12/2018 | Gellineau et al. |
| 2019/0017946 A1 | 1/2019 | Wack et al. |
| 2019/0072496 A1 | 3/2019 | Barbu et al. |
| 2019/0212281 A1 | 7/2019 | Shchegrov et al. |
| 2019/0215940 A1 | 7/2019 | Khodykin et al. |
| 2020/0266112 A1 | 8/2020 | Volkovich et al. |

OTHER PUBLICATIONS

International Search Report dated Apr. 19, 2021, for PCT Application No. PCT/US2021/012236 filed on Jan. 6, 2021 by KLA Corporation, 4 pages.

METHODS AND SYSTEMS FOR OVERLAY MEASUREMENT BASED ON SOFT X-RAY SCATTEROMETRY

CROSS REFERENCE TO RELATED APPLICATION

The present application for patent claims priority under 35 U.S.C. § 119 from U.S. provisional patent application Ser. No. 62/958,089, entitled "System and Method for Measuring Overlay and Edge Placement Error With Soft X-ray Scatterometry," filed Jan. 7, 2020, the subject matter of which is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. Similarly, electron based metrology tools suffer from inadequate depth of penetration without damaging the sample. In addition, the increasing number of parameters required to characterize complex structures (e.g., FinFETs), leads to increasing parameter correlation. As a result, the parameters characterizing the target often cannot be reliably decoupled with available measurements. For some structural parameters, such as edge placement error (EPE), there is currently no high throughput (e.g., optical) measurement solution.

Currently, several technologies are employed to measure overlay and critical dimensions (CD) with varying levels of success. Optical and electron beam metrology techniques are employed to perform CD and overlay measurements, typically on specialized metrology targets.

Optical measurements of overlay are predominantly based on either optical imaging or non-imaging diffraction (scatterometry). However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Using existing methods, overlay error is typically evaluated based on measurements of specialized target structures formed at various locations on the wafer by a lithography tool. In some examples, spatially separated gratings are employed for imaging-based optical overlay measurements. In some other examples, box in box structures are employed for imaging-based optical overlay measurements. In this form, a box is created on one layer of the wafer and a second, smaller box is created on another layer. The localized overlay error is measured by comparing the alignment between the centers of the two boxes. Such measurements are taken at locations on the wafer where target structures are available. In some examples, overlapping gratings or interleaved gratings are employed for scatterometry-based optical overlay measurements or electron-beam overlay measurements.

Unfortunately, these specialized target structures often do not conform to the design rules of the particular semiconductor manufacturing process being employed to generate the electronic device. This leads to errors in estimation of overlay errors associated with actual device structures that are manufactured in accordance with the applicable design rules.

In one example, image-based optical overlay metrology is severely limited by the resolution of imaging at optical wavelengths. Thus, only targets with features much larger than the design rule can be measured. Image-based optical overlay metrology often requires the pattern to be resolved with an optical microscope that requires thick lines with critical dimensions far exceeding design rule critical dimensions.

In another example, scatterometry-based optical overlay metrology based on 0th order diffraction has very low sensitivity to small overlay errors as the sensitivity decreases with the pitch of the periodic targets. This drives the pitch to much larger dimensions than the design rule of the device. Moreover, the accuracy of this measurement approach degrades dramatically in the presence of any asymmetry in any of the layers where overlay is measured. In addition, this approach cannot differentiate between positive and negative overlay errors in a single measurement.

In another example, scatterometry-based optical overlay metrology based on diffraction orders higher than zero also require relatively large pitch targets to generate sufficient signal at nonzero propagating diffraction orders. An overlay asymmetry optical signal is typically generated from periodic targets having a pattern pitch comparable to the optical wavelength of the illumination light. In some examples, pitch values in the range 500-800 nm may be used. Meanwhile, actual device pitches for logic or memory applications (design rule dimensions) are much smaller, e.g., in the range 100-400 nm, or even below 100 nm. In addition, the accuracy of this approach degrades dramatically in the presence of any asymmetry in any of the layers where overlay is measured. Decreasing the optical wavelength of the illumination into the deep ultraviolet and vacuum ultraviolet range does not help as these photons are attenuated and do not sufficiently penetrate multiple layer structures to reach underlying patterns required to evaluate overlay and edge placement error.

Electron based metrology techniques such as Scanning Electron Microscopy (SEM) and E-beam metrology are able to resolve nanometer-scale features and measure non-periodic structures such as random logic. However, electron based metrology systems are destructive when employed to measure actual devices. In addition, electron based metrology systems are low throughput. Measurement times may be on the order of a few seconds per measurement site. In addition, electron based metrology systems are top-down imaging systems that provide very limited three dimensional measurement capability. For example, when SEM is employed to measure overlay between overlapping gratings, it loses the ability to measure CD and EPE due to increased point spread function with penetration depth. Further details are described in U.S. Pat. No. 10,473,460 to Gutman et al., and assigned to KLA-Tencor Corporation, the content of which is incorporated herein by reference in its entirety. In general, SEM achieves intermediate resolution levels, but is unable to penetrate structures to sufficient depth without destroying the sample. In addition, the required charging of the specimen has an adverse effect on imaging performance.

Atomic force microscopes (AFM) and scanning-tunneling microscopes (STM) are able to achieve atomic resolution, but they can only probe the surface of the specimen. In addition, AFM and STM microscopes require long scanning times.

Transmission electron microscopes (TEM) achieve high resolution levels and are able to probe arbitrary depths, but TEM requires destructive sectioning of the specimen.

To overcome some limitations of optical and electron based metrology for measurement of overlay and EPE, an absolute registration measurement technique may be employed. An accurate translation stage having a range equal to the spatial separation between any two patterns is employed to measure the absolute distance between features. This result is employed to assist in the evaluation of overlay, CD, and EPE. Unfortunately, the absolute registration measurement technique requires an accurate stage, adds complexity to the measurement tool, and limits throughput. Furthermore, the technique may not perform well on pattern-over-pattern targets or device structures. Further details are described in WIPO Publication No. 2019/173171 by Shchegrov et al., and assigned to KLA-Tencor Corporation, the content of which is incorporated herein by reference in its entirety.

In summary, semiconductor device yield at device fabrication nodes below 20 nanometers for logic devices and advanced DRAM, and vertical or planar NAND devices is a complex function of many parameters, including film thicknesses, profile parameters of patterned lines, overlay errors, and edge placement errors (EPE). Of these, EPE has the most demanding process window and requires metrology and control of CD and overlay. Currently there is no high-throughput, optical metrology solution for EPE measurements and many design-rule overlay measurement applications. In addition, the absence of adequate metrology makes it challenging to define control schemes to improve device yield.

Future metrology applications present challenges for metrology due to increasingly small resolution requirements, multi-parameter correlation, increasingly complex geometric structures, and increasing use of opaque materials. Thus, methods and systems for improved overlay and shape measurements are desired.

SUMMARY

Methods and systems for performing overlay and edge placement errors based on Soft X-Ray (SXR) scatterometry measurement data are presented herein. Short wavelength SXR radiation focused over a small illumination spot size enables measurement of design rule targets, i.e., targets having same or approximately the same pitch as nearby in-die active device structures, or in-die active device structures themselves. In addition to providing overlay metrology capability, the methods and systems described herein enhance the precision and accuracy of shape parameter measurements by strongly de-correlating geometric parameters of the measured structures.

SXR illumination radiation enables penetration into opaque areas and under-layers of a target. In some embodiments, SXR scatterometry measurements are performed with SXR radiation having energy in a range from 10 to 5,000 electronvolts. Typically, diffraction limits and other optical effects control the minimum possible target size for shape and overlay measurements. Due to the relatively short wavelengths of SXR illumination, SXR scatterometry measurements can be performed on metrology targets having a relatively small target area.

SXR penetration to underlayers enables SXR scatterometry measurements with relatively high sensitivity to signals required to estimate overlay, CD, and EPE. Furthermore, SXR scatterometry overlay measurement of design rule targets more closely represents actual device overlay, compared to traditional overlay targets having much larger pitch. SXR scatterometry enables overlay measurements on design-rule targets because the illumination wavelength(s) are shorter than the period of the measured design-rule targets. As a result, measurements at SXR wavelengths permits target design at process design rules.

In some examples, SXR scatterometry measurements of overlay are based on direct measurement of actual device structures, e.g., SRAM.

In some embodiments, the design rule targets include multiple layers each having an underlying periodicity. SXR scatterometry enables measurement of multiple layer design rule targets with high sensitivity to underlayer patterns. In some of these embodiments, the top layer of the design rule target is a photoresist layer. In this manner, SXR scatterometry enables After-Develop Inspection (ADI) process monitoring.

In one aspect, a SXR scatterometry system is configured to estimate overlay error between different layers of a design rule metrology target or in-die active device structures from non-zero diffraction orders scattered from the structure under measurement. Due to the relatively short wavelengths of SXR radiation, nonzero diffraction orders, and the +/−1 diffraction orders in particular, provide relatively high sensitivity to overlay error.

In some embodiments, SXR scatterometry measurements of overlay and shape parameters are performed simultaneously from SXR scatterometry measurements collected from the same metrology target. This enables measurements of Edge Placement Errors (EPE), such as end line shortening, line to contact distance, etc. As a result, SXR scatterometry enables edge placement error (EPE) measurements without errors due to target bias, which occur when overlay and CD measurements are performed on different targets. In addition, simultaneous measurement of overlay and CD structure parameters from the same metrology target improves both measurement accuracy and throughput.

In some embodiments, SXR scatterometry measurement signals from two cells of a metrology target each having a nominal offset in opposite directions are employed to resolve overlay error.

In some examples, metrology based on SXR scatterometry involves determining parameters of interest, e.g., overlay error, shape parameters, etc., characterizing the sample by the inverse solution of a pre-determined measurement model with the measured SXR scatterometry data. In this manner, target parameters are estimated by solving for values of a parameterized measurement model that minimize errors between the measured scattered x-ray intensities and modeled results.

In some embodiments, the value of overlay error associated with a measurement target or an in-die target is directly determined from detected intensities within one or more nonzero diffraction orders based on a trained machine-learning based measurement model. In these embodiments, a trained machine learning based model directly extracts overlay error from SXR measurement data.

In some embodiments, a SXR scatterometry based overlay measurement involves illuminating a sample with SXR radiation and detecting the intensities of the resulting diffraction orders for multiple angles of incidence relative to the sample, multiple wavelengths, or both. Furthermore, the overlay error associated with the measurement target is determined based on modulations in the plurality of intensities within each of the one or more nonzero diffraction orders at each of the multiple measurement instances.

In another aspect, the actual device target is aperiodic. By calibrating overlay measurements to a reference measurement, SXR scatterometry techniques can be applied to estimate overlay of aperiodic structures based on measurements of design rule targets with sufficient periodicity. This effectively overcomes the limitation of scatterometric measurements requiring the measured target to be periodic or approximately periodic.

In some embodiments, a multiple layer overlay metrology target is designed with different pitch at different layers such that a diffraction order arising from one layer constructively interferes with a different diffraction order of another layer. Conversely, intensity measurements detected at different order number pairs not subject to constructive interference in overlay are dominated by shape parameters. Thus, in some embodiments, a metrology overlay target is designed with specific grating structures to increase sensitivity to overlay at specific grating order pairs, and also provide intensity data useful for estimation of shape parameter values.

In some embodiments, a multiple layer overlay metrology target is designed with different pitch orientations at different layers such that a diffraction order arising from one layer constructively interferes with a different diffraction order of another layer. In general, a set of layers having different periodicities (e.g., different grating pitches), different pitch orientations, or any combination thereof, gives rise to a set of scattering vectors, each associated with a different layer. The overlay metrology target is designed such that a predetermined subset of the scattering vectors are aligned. In this manner, the sensitivity to overlay among the layers corresponding with the predetermined subset of scattering vectors is enhanced.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Figure 1:
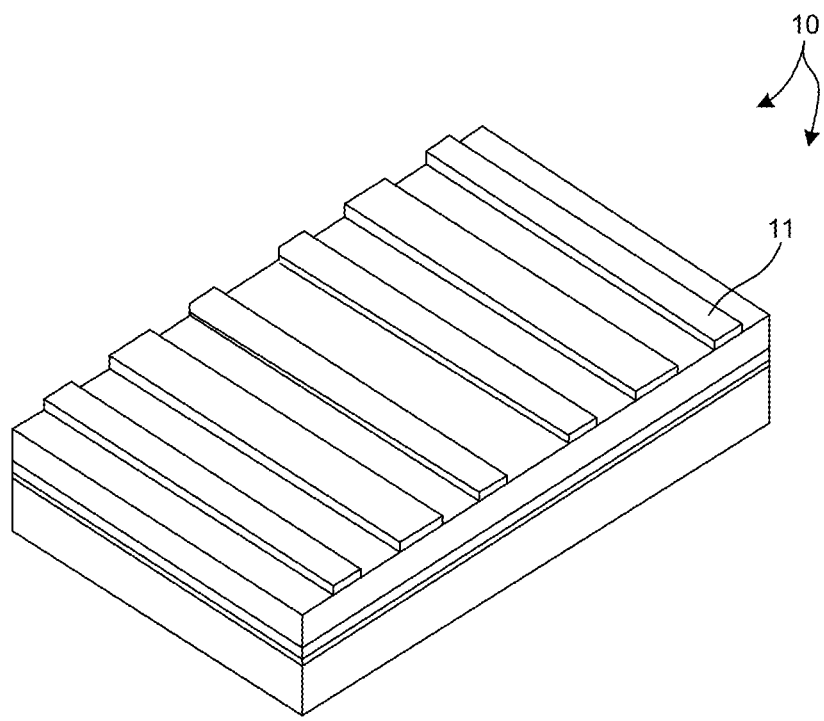
FIG. 1 is a diagram illustrative of a hardmask pattern of line structures 11 fabricated in a static random access memory (SRAM) area 10 of a microelectronic chip.
Figure 2:
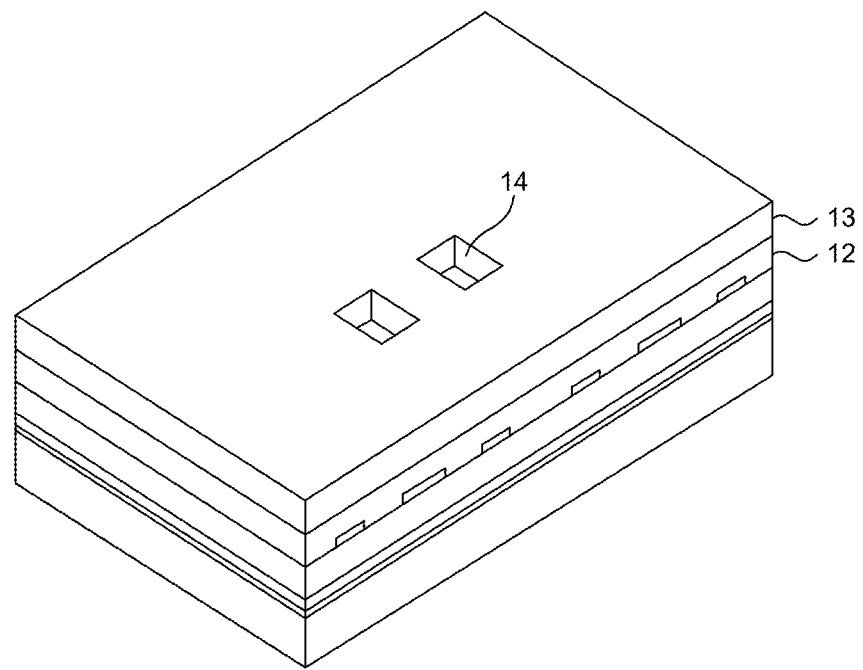
FIG. 2 is a diagram illustrative of a bottom anti-reflective coating (BARC) layer 12 and a resist layer 13 disposed on top of the pattern of line structures depicted in FIG. 1.

FIG. 1 depicts a hardmask pattern of line structures 11 fabricated in a static random access memory (SRAM) area 10 of a microelectronic chip. The complex layout of the active region is created by combining multiple patterning techniques with cut masks. Cut masks selectively remove portions of the hardmask layer that is used to pattern the substrate into active regions. FIG. 2 depicts a bottom anti-reflective coating (BARC) layer 12 and a resist layer 13 disposed on top of the pattern of line structures depicted in FIG. 1. The resist layer is used to selectively remove part of the hardmask pattern below the openings 14 of the resist layer 13. As depicted in FIG. 1, the hardmask pattern of line structures 11 is buried by the BARC layer 12, even within the openings 14 of the resist layer 13.

To provide adequate yield for the cut mask process, reliable measurements for shape parameters (e.g., CD, HT, SWA, profile parameter, etc.), film thicknesses, and overlay are required. A calculation of overlay reveals that it is a function of many structural parameters from previous steps of a quadruple patterning process. The distribution of the gap between the edge of the cut and the adjacent line structure, and hence the yield of the process, depends on a complex interaction of all the process parameters.

In another example, edge placement distance (EPD) and the associated edge placement error (EPE) is an important parameter to monitor and control after device electrical contacts are made. The difference between the desired and the actual EPD is called EPE. EPD and EPE are a function of both overlay and CD errors.

Methods and systems for performing overlay and edge placement errors of structures and materials based on Soft X-Ray (SXR) scatterometry measurement data are presented. Short wavelength SXR radiation focused over a small illumination spot size enables measurement of design rule targets, i.e., targets having same or approximately the same pitch as nearby in-die active device structures, or in-die active device structures themselves. The methods and systems presented herein may be applied to two and three dimensional design rule metrology targets, located within or outside of functional die. In addition to providing overlay metrology capability, the methods and systems described herein enhance the precision and accuracy of shape parameter measurements by strongly de-correlating geometric parameters of the measured structures.

SXR illumination radiation enables penetration into opaque areas and under-layers of a target. Examples of measureable geometric parameters using SXR scatterometry includes pore size, pore density, line edge roughness, line width roughness, side wall angle, profile, critical dimension, overlay, edge placement error, and pitch. Examples of measureable material parameters include electron density, elemental identification and composition. In some examples, SXR scatterometry enables the measurement of features smaller than 10 nm as well as advanced semiconductor structures such as spin-transfer-torque MRAM where measurements of geometrical parameters and material parameters are needed.

In some embodiments, SXR scatterometry measurements are performed with SXR radiation having energy in a range from 10 to 5,000 electronvolts. Typically, diffraction limits and other optical effects control the minimum possible target size for shape and overlay measurements. Due to the relatively short wavelengths of SXR illumination, SXR scatterometry measurements can be performed on metrology targets having a relatively small target area. In some embodiments, SXR scatterometry measurements are performed on metrology targets over an area having a dimension of maximum extent less than 5 micrometers. In some embodiments, SXR scatterometry measurements are performed on metrology targets over an area having a dimension of maximum extent less than 2 micrometers.

In some embodiments, the design rule targets include multiple layers each having an underlying periodicity. SXR scatterometry enables measurement of multiple layer design rule targets with high sensitivity to underlayer patterns. In some of these embodiments, the top layer of the design rule target is a photoresist layer. In this manner, SXR scatterometry enables After-Develop Inspection (ADI) process monitoring.

SXR penetration to underlayers enables SXR scatterometry measurements with relatively high sensitivity to signals required to estimate overlay, CD, and EPE. Furthermore, SXR scatterometry overlay measurement of design rule targets more closely represents actual device overlay, compared to traditional overlay targets having much larger pitch. In some examples, SXR scatterometry measurements of overlay are based on direct measurement of actual device structures, e.g., SRAM.

In one aspect, a SXR scatterometry system is configured to estimate overlay error between different layers of a design rule metrology target or in-die active device structures from non-zero diffraction orders scattered from the structure under measurement.

Figure 3:
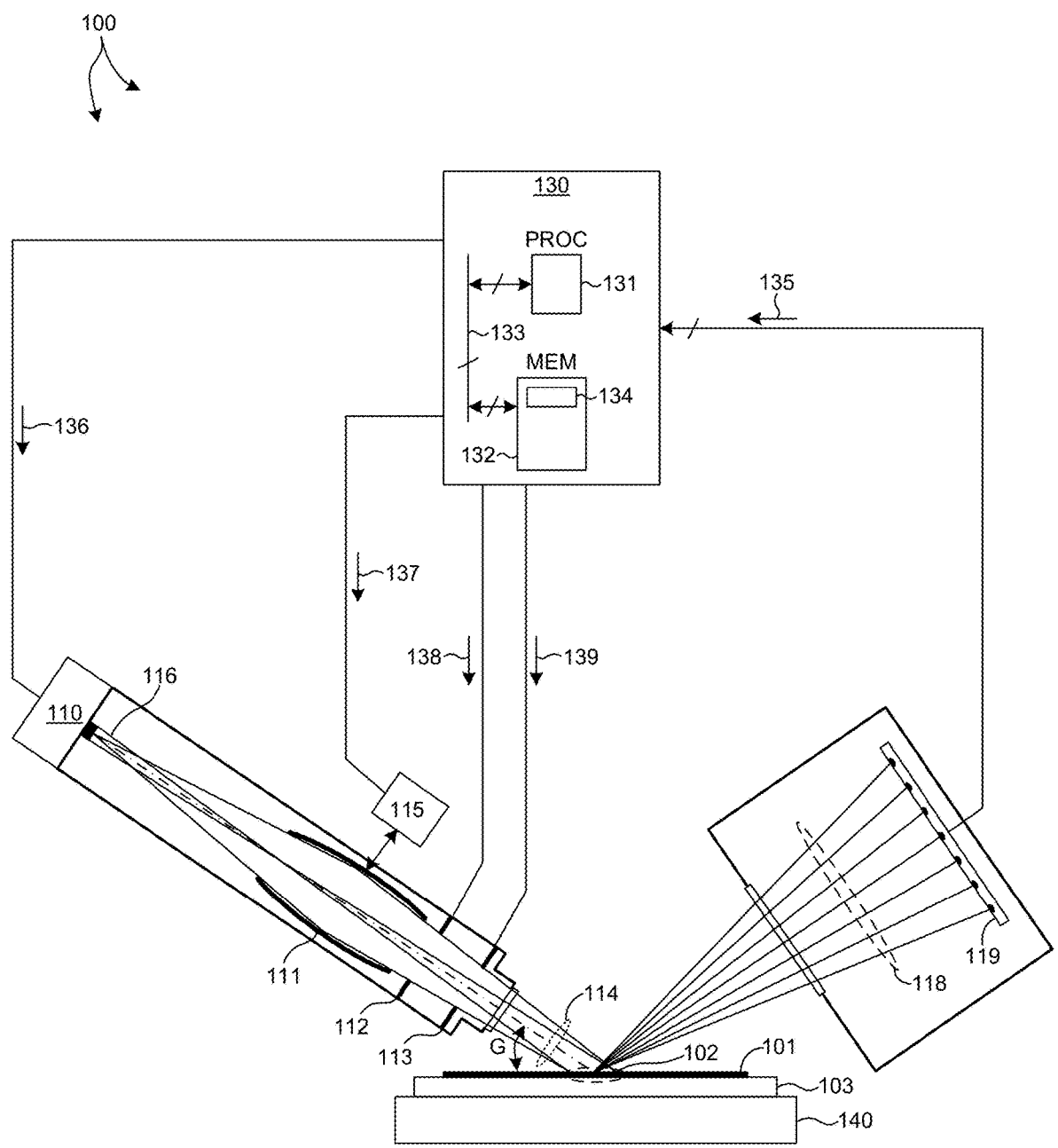
FIG. 3 is a diagram illustrative of an embodiment of an Soft X-Ray (SXR) metrology tool 100 for measuring characteristics of a specimen in accordance with the exemplary methods presented herein.

FIG. 3 illustrates an embodiment of a SXR scatterometry tool 100 for measuring characteristics of a specimen in at least one novel aspect. As shown in FIG. 3, the system 100 may be used to perform SXR scatterometry measurements over a measurement area 102 of a specimen 101 illuminated by an incident illumination beam spot.

In the depicted embodiment, metrology tool 100 includes an x-ray illumination source 110, focusing optics 111, beam divergence control slit 112, and slit 113. The x-ray illumination source 110 is configured to generate SXR radiation suitable for SXR scatterometry measurements. In some embodiments, X-ray illumination source 110 is a polychromatic, high-brightness, large etendue source. In some embodiments, the x-ray illumination source 110 is configured to generate x-ray radiation in a range between 10-5000 electron-volts. In general, any suitable high-brightness x-ray illumination source capable of generating high brightness SXR at flux levels sufficient to enable high-throughput, inline metrology may be contemplated to supply x-ray illumination for SXR measurements.

In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, illumination source 110 is a high harmonic generation (HHG) x-ray source. In some other embodiments, illumination source 110 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some other embodiments, illumination source 110 is a laser produced plasma (LPP) light source. In some of these embodiments the LPP light source includes any of Xenon, Krypton, Argon, Neon, and Nitrogen emitting materials. In general, the selection of a suitable LPP target material is optimized for brightness in resonant SXR regions. For example, plasma emitted by Krypton provides high brightness at the Silicon K-edge. In another example, plasma emitted by Xenon provides high brightness throughout the entire SXR region of (10-5000 eV).

LPP target material selection may also be optimized for reliable and long lifetime light source operation. Noble gas target materials such as Xenon, Krypton, and Argon are inert and can be reused in a closed loop operation with minimum or no decontamination processing. An exemplary SXR illumination source is described in U.S. Patent Publication No. 2019/0215940 by Khodykin et al., and assigned to KLA-Tencor Corporation, the content of which is incorporated herein by reference in its entirety.

In some embodiments, the wavelengths emitted by the illumination source (e.g., illumination source 110) are selectable. In some embodiments, illumination source 110 is a LPP light source controlled by computing system 130 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating SXR radiation. As depicted in FIG. 3, computing system 130 communicates command signals 136 to illumination source 110 that cause illumination source 110 to adjust the spectral range of wavelengths emitted from illumination source 110. In one example, illumination source 110 is a LPP light source, and the LPP light source adjusts any of a pulse duration, pulse frequency, and target material composition to realize a desired spectral range of wavelengths emitted from the LPP light source.

By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. In one embodiment, the source area of illumination source 110 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In general, x-ray optics shape and direct x-ray radiation to specimen 101. In some examples, the x-ray optics collimate or focus the x-ray beam onto measurement area 102 of specimen 101 to less than 1 milliradian divergence using multilayer x-ray optics. In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

As depicted in FIG. 3, focusing optics 111 focuses source radiation onto a metrology target located on specimen 101. The finite lateral source dimension results in finite spot size 102 on the target defined by the rays 116 coming from the edges of the source and any beam shaping provided by beam slits 112 and 113.

In some embodiments, focusing optics 111 include elliptically shaped focusing optical elements. In the embodiment depicted in FIG. 3, the magnification of focusing optics 111 at the center of the ellipse is approximately one. As a result, the illumination spot size projected onto the surface of specimen 101 is approximately the same size as the illumination source, adjusted for beam spread due to the nominal incidence angle, G.

In a further aspect, focusing optics 111 collect source emission and select one or more discrete wavelengths or spectral bands, and focus the selected light onto specimen 101 at a desired nominal angle of incidence.

The nominal incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility SXR measurements probe more deeply into the structure with less sensitivity to the precise value of the nominal incidence angle.

In some embodiments, focusing optics 111 include graded multi-layers that select desired wavelengths or ranges of wavelengths for projection onto specimen 101. In some examples, focusing optics 111 includes a graded multi-layer structure (e.g., layers or coatings) that selects one wavelength and projects the selected wavelength onto specimen 101 over a range of angles of incidence about the nominal angle of incidence. In some examples, focusing optics 111 includes a graded multi-layer structure that selects a range of wavelengths and projects the selected wavelengths onto specimen 101 over one angle of incidence. In some examples, focusing optics 111 includes a graded multi-layer structure that selects a range of wavelengths and projects the selected wavelengths onto specimen 101 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to specimen 101, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In some embodiments, focusing optics 111 include a plurality of reflective optical elements each having an elliptical surface shape. Each reflective optical element includes a substrate and a multi-layer coating tuned to reflect a different wavelength or range of wavelengths. In some embodiments, a plurality of reflective optical elements (e.g., 1-5) each reflecting a different wavelength or range of wavelengths are arranged at each angle of incidence. In a further embodiment, multiple sets (e.g., 2-5) of reflective optical elements each reflecting a different wavelength or range of wavelengths are arranged at a different nominal angle of incidence. In some embodiments, the multiple sets of reflective optical elements simultaneously project illumination light onto specimen 101 during measurement. In some other embodiments, the multiple sets of reflective optical elements sequentially project illumination light onto specimen 101 during measurement. In these embodiments, active shutters or apertures are employed to control the illumination light projected onto specimen 101.

In some embodiments, the ranges of wavelengths, AOI, Azimuth, or any combination thereof, projected onto the same metrology area, are adjusted by actively positioning one or more mirror elements of the focusing optics. As depicted in FIG. 3, computing system 130 communicates command signals 137 to actuator system 115 that causes actuator system 115 to adjust the position, alignment, or both, of one or more of the optical elements of focusing optics 111 to achieve the desired ranges of wavelengths, AOI, Azimuth, or any combination thereof, projected onto specimen 101.

In general, the angle of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In some embodiments, a SXR scatterometry system (e.g., metrology tool 100) includes one or more beam slits or apertures to shape the illumination beam 114 incident on specimen 101 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In some embodiments, a SXR scatterometry system (e.g., metrology tool 100) includes one or more beam slits or apertures to select a set of illumination wavelengths that simultaneously illuminate a metrology target under measurement. In these embodiments, one or more slits are configured to pass illumination including multiple illumination wavelengths. In general, simultaneous illumination of a metrology target under measurement is preferred to increase signal information and throughput. However, in practice, overlap of diffraction orders at the detector limits the range of illumination wavelengths. In some embodiments, one or more slits are configured to sequentially pass different illumination wavelengths. In some examples, sequential illumination at larger angular divergence provides higher throughput because the signal to noise ratio for sequential illumination may be higher compared to simultaneous illumination when beam divergence is larger. When measurements are performed sequentially the problem of overlap of diffraction orders is not an issue. This increases measurement flexibility and improves signal to noise ratio.

FIG. 3 depicts a beam divergence control slit 112 located in the beam path between focusing optics 111 and beam shaping slit 113. Beam divergence control slit 112 limits the divergence of the illumination provided to the specimen under measurement. Beam shaping slit 113 is located in the beam path between beam divergence control slit 112 and specimen 101. Beam shaping slit 113 further shapes the incident beam 114 and selects the illumination wavelength(s) of incident beam 114. Beam shaping slit 113 is located in the beam path immediately before specimen 101. In some embodiments, the slits of beam shaping slit 113 are located in close proximity to specimen 101 to minimize the enlargement of the incident beam spot size due to beam divergence defined by finite source size. As depicted in FIG. 3, computing system 130 communicates command signals 138 to beam divergence control slit 112 that causes active elements of the beam divergence control slit 112 to adjust the position, alignment, or both, of one or more of the optical elements of beam divergence control slit 112 to achieve the desired beam divergence.

Similarly, as depicted in FIG. 3, computing system 130 communicates command signals 139 to beam shaping slit 113 that causes active elements of the beam shaping slit 113 to adjust the position, alignment, or both, of one or more of the optical elements of beam shaping slit 113 to achieve the desired beam shape projected onto specimen 101.

In some embodiments, beam shaping slit 113 includes multiple, independently actuated beam shaping slits. In one embodiment, beam shaping slit 113 includes four independently actuated beam shaping slits. These four beams shaping slits effectively block a portion of the incoming beam and generate an illumination beam 114 having a box shaped illumination cross-section.

Slits of beam shaping slit 113 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

In some embodiments, the focusing optics of an SXR scatterometry system projects an image of the illumination source onto the specimen under measurement with a demagnification of at least five (i.e., magnification factor of 0.2 or less). In some embodiments, an SXR scatterometry system as described herein employs a SXR illumination source having a source area characterized by a lateral dimension of 20 micrometers or less (i.e., source size is 20 micrometers or smaller). In some embodiments, focusing optics are employed with a demagnification factor of at least five (i.e., project an image of the source onto the wafer that is five times smaller than the source size) to project illumination onto a specimen with an incident illumination spot size of four micrometers or less.

In some embodiments, illumination source 110 is an LPP light source having a source size of 10 micrometers, or less, and focusing optics 111 have a demagnification factor of approximately 10. This enables an SXR scatterometry tool to focus illumination light onto a metrology target having dimensions of 1-2 micrometers. The ability to measure targets having dimensions of 1-2 micrometers reduces the wafer area committed to specialized metrology targets. In addition, the ability to measure targets having dimensions of 1-2 micrometers enables the direct measurement of device structures, rather than specialized metrology targets. Measuring device structures directly eliminates target-to-device bias. This significantly improves measurement quality. In addition, measurements of in-die targets enable characterization of parameter variation within-die. Exemplary parameters of interest include critical dimensions, overlay, and edge placement errors.

X-ray detector 119 collects x-ray radiation 118 scattered from specimen 101 and generates output signals 135 indicative of properties of specimen 101 that are sensitive to the incident x-ray radiation in accordance with a SXR scatterometry measurement modality. In some embodiments, scattered x-rays 118 are collected by x-ray detector 119 while specimen positioning system 140 locates and orients specimen 101 to produce angularly resolved scattered x-rays.

In some embodiments, a SXR scatterometry system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

It some examples, it is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

In some embodiments, metrology tool 100 includes a wafer chuck 103 that fixedly supports wafer 101 and is coupled to specimen positioning system 140. Specimen positioning system 140 configured to actively position specimen 101 in six degrees of freedom with respect to illumination beam 114. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

In a further aspect, a SXR scatterometry system is employed to determine properties of a specimen (e.g., structural parameter values) based on one or more diffraction orders of scattered light. As depicted in FIG. 3, metrology tool 100 includes a computing system 130 employed to acquire signals 135 generated by detector 119 and determine properties of the specimen based at least in part on the acquired signals.

SXR scatterometry enables overlay measurements on design-rule targets because the illumination wavelength(s) are shorter than the period of the measured structures. This provides a significant benefit over existing technology where overlay is measured on larger than the design rule targets. Use of SXR wavelengths permits target design at process design rules, i.e., no "non-zero offsets". The reduction in non-zero offset is the result of reduced pattern placement error and a process optimized for patterning at the device pitch. Pattern placement errors depend on the manufacturing process, which is driven by the pattern pitch. As the pattern pitch is reduced, the pattern placement errors are also reduced. Furthermore, as the manufacturing process is optimized to the device pitch, local asymmetric deformation of device characteristic patterns (e.g., device-like patterns) is reduced.

An overlay metrology target for SXR measurements may include a one dimensional periodic array or two-dimensional periodic arrays. One dimensional targets exhibit large angular divergence along the plane of incidence, increasing flux and throughput. For two dimensional targets angular dispersion of diffraction is not equivalent for the two in-plane axes. Thus, for sample directions parallel to the plane of incidence, an additional, super-period may be imposed. In these examples, it may be advantageous to rotate the wafer and perform sequential, orthogonal measurements by a single subsystem on the same target.

In one aspect, SXR scatterometry signals are employed to resolve overlay error based on nonzero diffraction orders. Due to the relatively short wavelengths of SXR radiation, nonzero diffraction orders, and the +/−1 diffraction orders in particular, provide relatively high sensitivity to overlay error.

In general, target design and associated measurement algorithms differ depending on whether 0th or 1st order scatterometry is employed. For 0th order scatterometry, each measured area, i.e., cell, of a metrology target yields a single 0th order signal as a function of wavelength, incidence angle, and azimuth angle. However, for $1^{st}$ order scatterometry, each measured area, i.e., cell, of a metrology target yields two signals, i.e., the +1 diffraction order signal and the −1 diffraction order signal, as a function of wavelength, incidence angle, and azimuth angle. Hence, in some examples, fewer cells are required to extract sufficient signal information to resolve a parameter of interest, e.g., overlay or a shape parameter, based on 1st order scatterometry. In these examples, smaller metrology targets may be employed. To be effective, 1st order scatterometry requires relatively high pupil uniformity. Calibration methodology to reduce the effect of pupil non-uniformity is provided in U.S. Patent Publication No. 2004/0169861 by Mieher et al, and assigned to KLA-Tencor Corporation, the content of which is incorporated herein by reference in its entirety.

In a further aspect, SXR scatterometry signals at zero order, nonzero orders, or any combination thereof, are employed to resolve the values of shape parameters characterizing structures under measurements, e.g., CD, H, SWA, profile parameters, etc. In some embodiments, SXR scatterometry measurements of overlay and shape parameters are performed simultaneously from SXR scatterometry measurements collected from the same metrology target. This enables measurements of Edge Placement Errors (EPE), such as end line shortening, line to contact distance, etc. As a result, SXR scatterometry enables edge placement error (EPE) measurements without errors due to target bias, which occur when overlay and CD measurements are performed on different targets. In addition, simultaneous measurement of overlay and CD structure parameters from the same metrology target improves both measurement accuracy and throughput.

In one example, an edge placement error between layers is estimated based on a measurement of overlay as described herein, and a measurement of a shape parameter based on the intensity measurements within each x-ray diffraction order measured at multiple, different angles of incidence and multiple, different azimuth angles. Edge placement errors (EPE) combine overlay and shape parameter (e.g., CD) errors. In one example, EPE is a difference between a CD value (e.g., width, W, depicted in FIG. 8) and an overlay value (e.g., overlay, D, depicted in FIG. 8). Thus, a measurement of EPE is streamlined by employing the computationally efficient overlay measurement described herein, and using the same intensity measurement data to estimate the CD parameter value.

Figure 4:
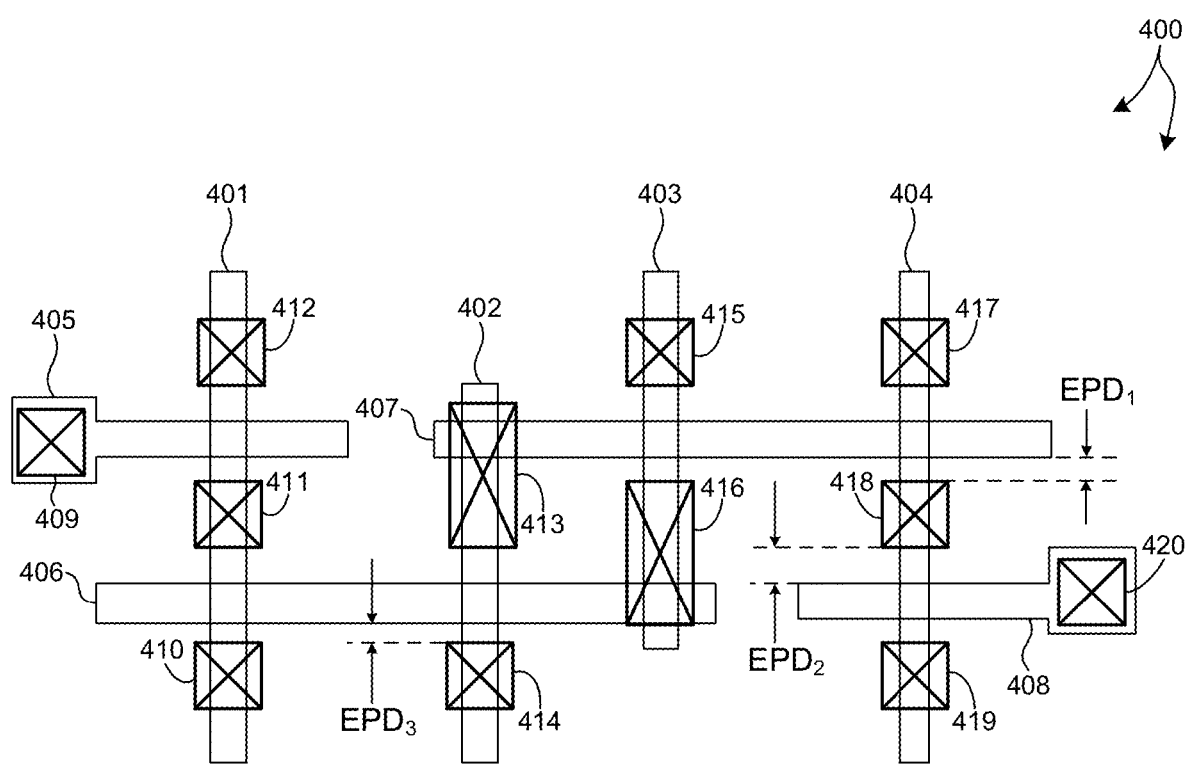
FIG. 4 is a diagram illustrative of a top view of device structure 400 that includes active fields 401-404, gates 405-408, and contacts 409-421.

FIG. 4 depicts a top view of device structure 400 that includes active fields 401-404, gates 405-408, and contacts 409-420. FIG. 4 illustrates the edge placement distance, $EPD_1$, between gate 407 and contact 418. FIG. 4 also illustrates the edge placement distance, $EPD_2$, between gate 408 and contact 418 and the edge placement distance $EPD_3$, between gate 406 and contact 414. The edge placement distances must be carefully controlled to ensure high device yield. If the edge placement error associated with any of these edge placement distances is too large, the device will fail. As illustrated in FIG. 4, both overlay errors and CD errors contribute to EPE. For example, EPE results if the layers associated with the contact are misaligned with the layers associated with the gates. Similarly, EPE results if the CD associated with the contact structures deviates from nominal dimensions. For example, contacts 413 and 416 are too large. The result is overlap between each contact and corresponding gate structure and device failure. Furthermore, the three-dimensional shape of each measured structure plays a role. In some examples, the sidewall angle cannot be ignored. In some of these examples, a structure is characterized by a top CD dimension and a bottom CD dimension, rather than a single CD dimension.

Additional details regarding EPE measurements are described in U.S. Patent Publication No. 2016/0003609 by Shchegrov et al., which is incorporated herein by reference in its entirety.

In some embodiments, SXR scatterometry measurement signals from two cells of a metrology target each having a nominal offset in opposite directions are employed to resolve overlay error.

Figure 5A:
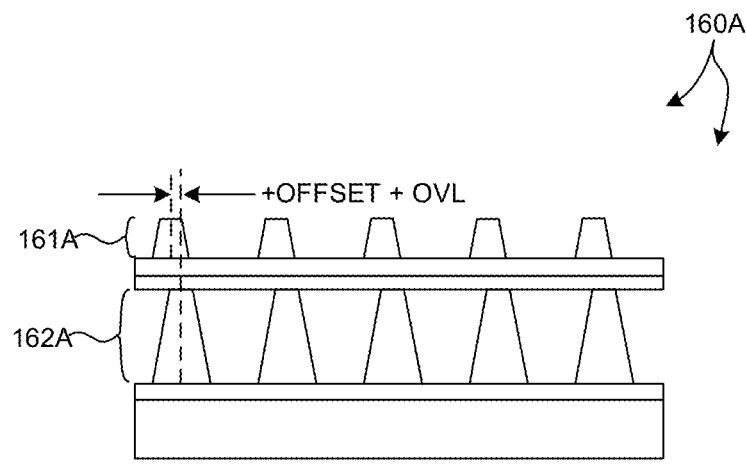
FIG. 5A depicts a cell having stacked grating structures offset from one another by a distance equal to the sum of a nominal offset in one direction, +OFFSET, and an overlay error, OVL.

FIG. 5A depicts cell 160A having a grating structure 161A stacked above another grating structure 162A. Grating structures 161A and 162A have the same pitch, but grating structure 161A is offset from grating structure 162A by a distance equal to the sum of a nominal offset in one direction, +OFFSET, and an overlay error, OVL.

Figure 5B:
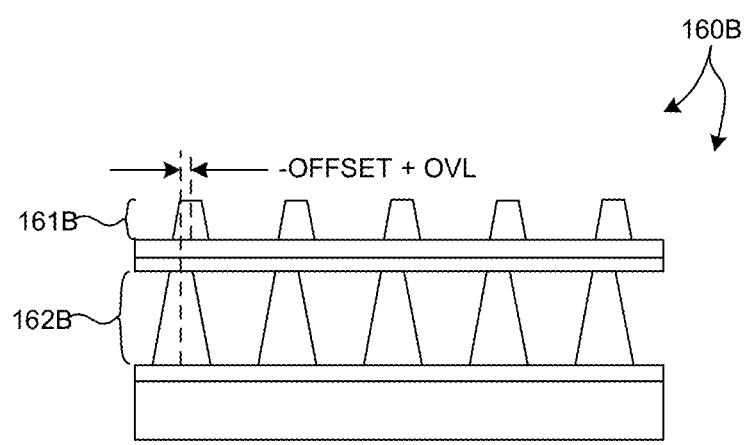
FIG. 5B depicts a cell having stacked grating structures offset from one another by a distance equal to the sum of a nominal offset in a direction opposite the nominal offset depicted in FIG. 5A, -OFFSET, and the overlay error, OVL.

FIG. 5B depicts cell 160B having a grating structure 161B stacked above another grating structure 162B. Grating structures 161B and 162B have the same pitch, but grating structure 161A is offset from grating structure 162A by a distance equal to a sum of the nominal offset in the opposite direction compared to metrology target 160A, −OFFSET, and the overlay error, OVL. Nominally, metrology targets 160A and 160B are the same, except that the direction of offset of the top grating structure with respect to the bottom grating structure is opposite.

The value of overlay error, OVL, associated with the measurement target is based the difference between the detected intensities within a +1 diffraction order and a −1 diffraction order associated with cell 160A and a difference between the detected intensities within the +1 diffraction order and the −1 diffraction order associated with cell 160B. In one example, computing system 130 determines difference signals, $D_1$ and $D_2$ as illustrated by equation (1), where $I_A^{+1}$ is the measured intensity of the +1 order from cell 160A, $I_A^{-1}$ is the measured intensity of the −1 order from cell 160A, $I_B^{+1}$ is the measured intensity of the +1 order from cell 160B, and $I_B^{-1}$ is the measured intensity of the −1 order from cell 160B.

$$D_1 = I_A^{+1} - I_A^{-1}$$
$$D_2 = I_B^{+1} - I_B^{-1} \quad (1)$$

Assuming a linear relationship between the differential signal values and the actual offset, overlay error is determined directly from the differential signals as illustrated by equation (2), wherein OFFSET is the magnitude of the nominal offset distance as described hereinbefore.

$$OverlayError = \text{OFFSET}\left(\frac{D_1 + D_2}{D_1 - D_2}\right) \quad (2)$$

In some examples, metrology based on SXR scatterometry involves determining parameters of interest, e.g., overlay error, shape parameters, etc., characterizing the sample by the inverse solution of a pre-determined measurement model with the measured SXR scatterometry data. The method of inverse solve includes, but is not limited to, model based regression, tomography, machine learning, or any combination thereof. In this manner, target parameters are estimated by solving for values of a parameterized measurement model that minimize errors between the measured scattered x-ray intensities and modeled results.

In some embodiments, computing system 130 is configured to generate a structural model (e.g., geometric model, material model, or combined geometric and material model) of a measured structure of a specimen, generate a SXR response model that includes at least one geometric parameter from the structural model, and resolve at least one specimen parameter value by performing a fitting analysis of SXR measurement data with the SXR response model. The analysis engine is used to compare the simulated SXR signals with measured data thereby allowing the determination of geometric as well as material properties such as electron density of the sample. In the embodiment depicted in FIG. 3, computing system 130 is configured as a model building and analysis engine configured to implement model building and analysis functionality as described herein.

Figure 6:
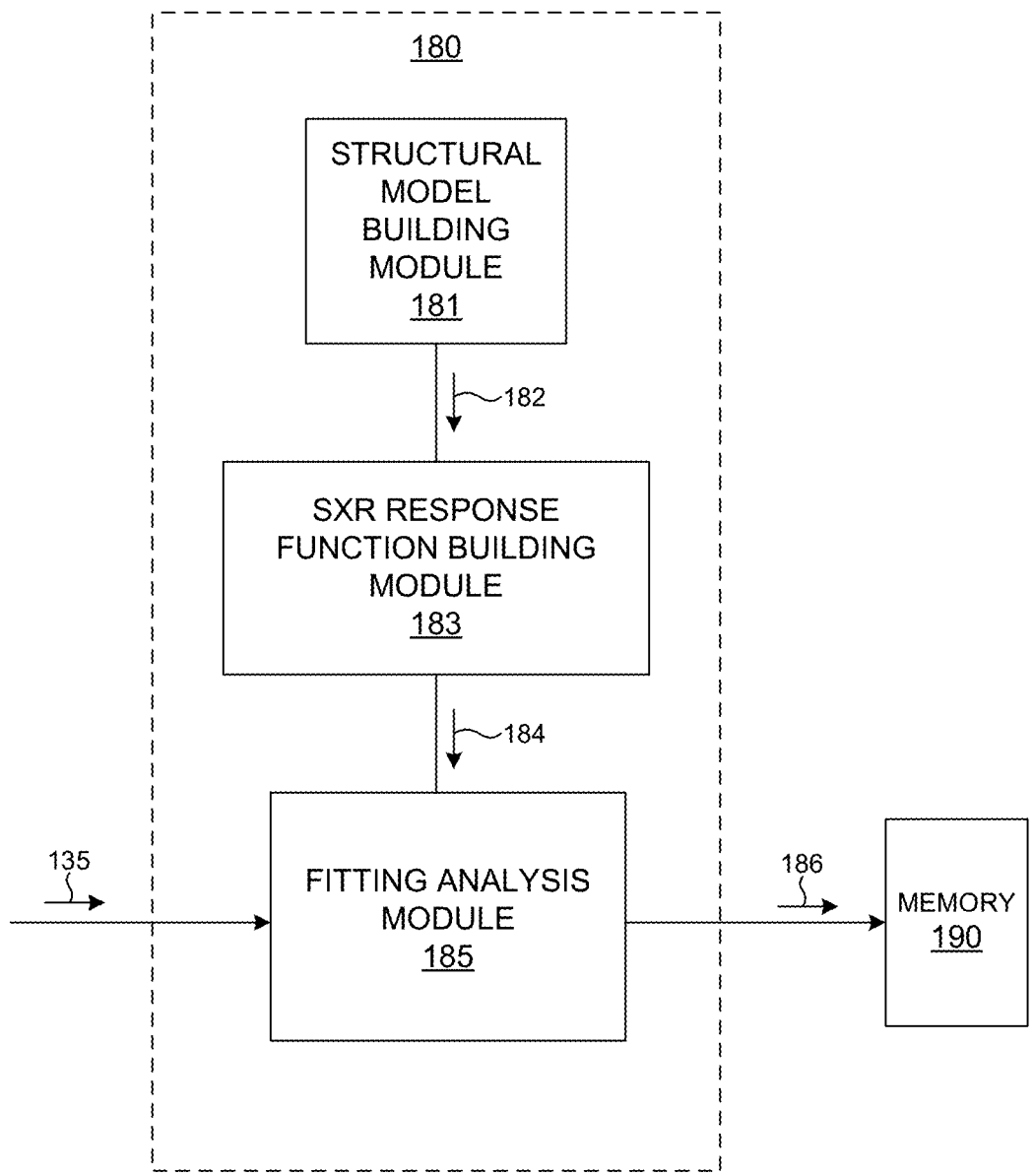
FIG. 6 is a diagram illustrative of a model building and analysis engine 180 configured to estimate overlay based on a model fitting analysis as described herein.

FIG. 6 is a diagram illustrative of an exemplary model building and analysis engine 180 implemented by computing system 130. As depicted in FIG. 6, model building and analysis engine 180 includes a structural model building module 181 that generates a structural model 182 of a measured structure of a specimen. The structural model 182 is received as input to SXR response function building module 183. SXR response function building module 183 generates a SXR response function model 184 based at least in part on the structural model 182. In some examples, the SXR response function model 184 is based on x-ray form factors, also known as structure factors, $$F(\vec{q}) = \int \rho(\vec{r}) e^{-i\vec{q}\cdot\vec{r}} d\vec{r} \quad (3)$$

where F is the form factor, q is the scattering vector, and ρ(r) is the electron density of the specimen in spherical coordinates. The x-ray scattering intensity is then given by $$I(\vec{q}) = F^*F \quad (4)$$

SXR response function model 184 is received as input to fitting analysis module 185. The fitting analysis module 185 compares the modeled SXR response with the corresponding measured data 135 to determine geometric as well as material properties of the specimen.

In some examples, the fitting of modeled data to experimental data is achieved by minimizing a chi-squared value. For example, for SXR measurements, a chi-squared value can be defined as $$\chi^2_{SXR} = \frac{1}{N_{SXR}} \sum_j^{N_{SXR}} \frac{\left(S_j^{SXR\,model}(v_1,\ldots,v_L) - S_j^{SXR\,experiment}\right)^2}{\sigma^2_{SXR,j}} \quad (5)$$

Where, $S_j^{SXR\,experiment}$ is the measured SXR signals 135 in the "channel" j, where the index j describes a set of system parameters such as diffraction order, energy, angular coordinate, etc. $S_j^{SXR\,model}(v_1, \ldots, v_L)$ is the modeled SXR signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SXR,j}$ is the uncertainty associated with the jth channel. $N_{SXR}$ is the total number of channels in the x-ray metrology. L is the number of parameters characterizing the metrology target.

Equation (5) assumes that the uncertainties associated with different channels are uncorrelated. In examples where the uncertainties associated with the different channels are correlated, a covariance between the uncertainties, can be calculated. In these examples a chi-squared value for SXR measurements can be expressed as $$\chi^2_{SXR} = \frac{1}{N_{SXR}} \left(\vec{S}_j^{SXR.\,model}(v_1,\ldots,v_M) \vec{S}_j^{SXR.\,experiment}\right)^T \quad (6)$$
$$V_{SXR}^{-1} \left(\vec{S}_j^{SXR.\,model}(v_1,\ldots,v_M) - \vec{S}_j^{SXR.\,experiment}\right)$$

where, $V_{SXR}$ is the covariance matrix of the SXR channel uncertainties, and T denotes the transpose.

In some examples, fitting analysis module 185 resolves at least one specimen parameter value by performing a fitting analysis on SXR measurement data 135 with the SXR response model 184. In some examples, $\chi_{SXR}^2$ is optimized.

As described hereinbefore, the fitting of SXR data is achieved by minimization of chi-squared values. However, in general, the fitting of SXR data may be achieved by other functions.

The fitting of SXR metrology data is advantageous for any type of SXR technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing SXR beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another further aspect, an initial estimate of values of one or more parameters of interest is determined based on SXR measurements performed at a single orientation of the incident x-ray beam with respect to the measurement target. The initial, estimated values are implemented as the starting values of the parameters of interest for a regression of the measurement model with measurement data collected from SXR measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In some embodiments, the value of overlay error associated with a measurement target or an in-die target is directly determined from detected intensities within one or more nonzero diffraction orders based on a trained machine-learning based measurement model. In these embodiments, a trained machine learning based model directly extracts overlay error from SXR measurement data.

In some embodiments, the target measured by the SXR metrology system is not periodic, yet the trained machine-learning based measurement model is able to extract overlay error from the SXR measurements.

In some embodiments, the machine-learning based measurement model is trained based on SXR measurement data collected from Design Of Experiments (DOE) targets having known values of overlay error. In some embodiments, the overlay error associated with the targets is measured by a trusted reference metrology system, such as an e-beam based metrology system, a scanning electron microscope, etc. In some embodiments, the DOE targets are design rule metrology targets. In some embodiments, the DOE targets are in-die active device structures.

In some examples, the machine-learning based measurement model is a neural network model, a support vector machine model, etc. Additional details are described in U.S. Pat. No. 10,352,876 to Shchegrov et al., and assigned to KLA-Tencor Corporation, the content of which is incorporated herein by reference in its entirety.

In some other embodiments, the machine-learning based measurement model is trained based on SXR measurement data collected from Design Of Experiments (DOE) targets, e.g., periodic targets, and known values of overlay error associated with in-die active device structures in close proximity to the measured DOE targets. In these embodiments, the overlay error associated with the in-die active device structures is measured by a trusted reference metrology system, such as an e-beam based metrology system, a scanning electron microscope, etc. In this manner, the trained machine-learning based measurement model estimates the overlay error of an in-die active device structure based on SXR scatterometry measurement data collected from a nearby design rule metrology target.

Figure 10:
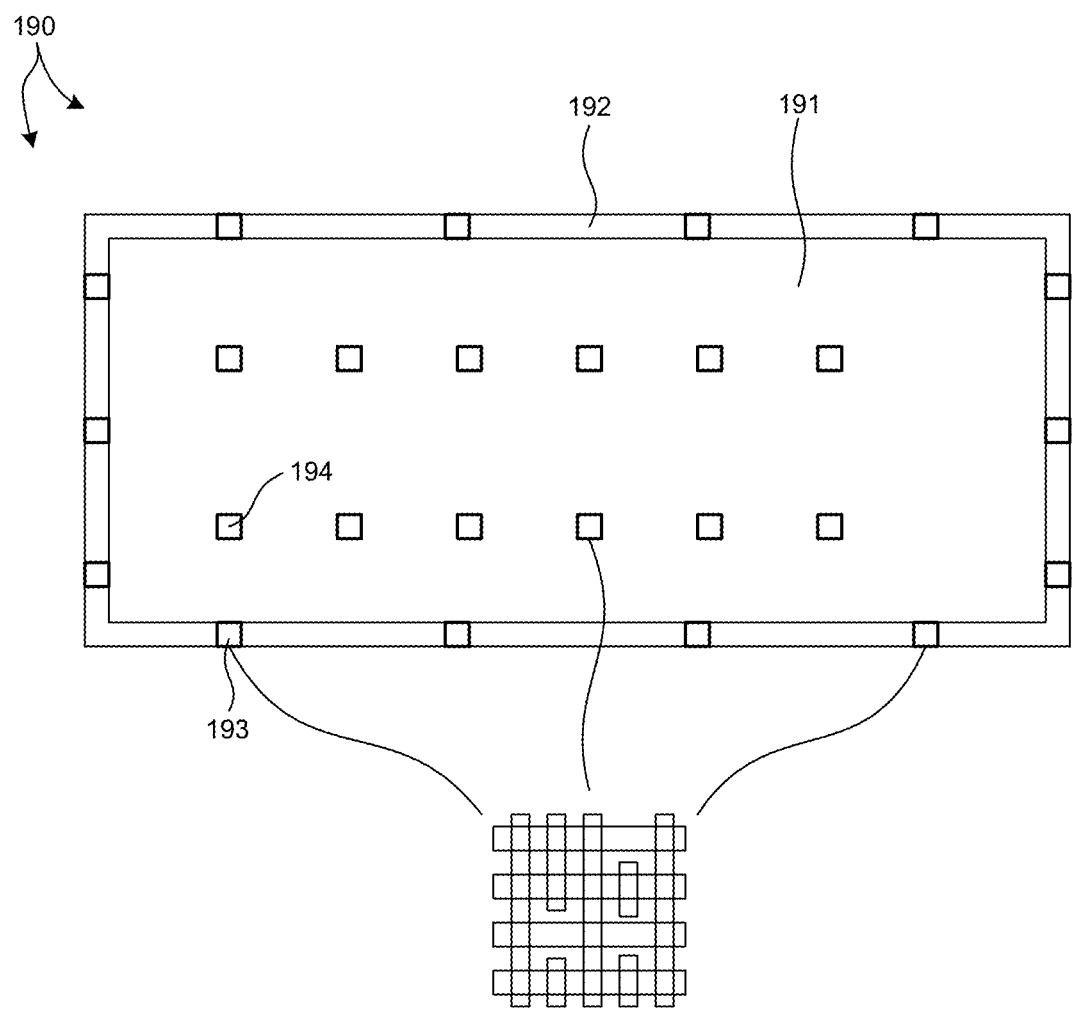
FIG. 10 is a diagram illustrative of a semiconductor die including active device structures fabricated in an active device area and design rule metrology targets fabricated in a scribe line area.

FIG. 10 illustrates a semiconductor die 190 including active device area 191 and scribe line area 192 circumscribing the active device area. A number of design rule metrology targets are fabricated within the scribe line area 192, such as design rule target 193. Similarly, a number of active device structures are fabricated within active device area 191, such as active device structure 194. In some embodiments, a trained machine-learning based measurement model estimates overlay error associated with active device structure 194 based on SXR scatterometry measurements of design rule target 193.

Additional details regarding machine-learning based measurement models are described in U.S. Patent Publication No. 2016/0003609 by Shchegrov et al., which is incorporated herein by reference in its entirety.

In some other embodiments, the machine-learning based measurement model is trained based on SXR measurement data collected from Design Of Experiments (DOE) targets and the values of shape parameters determined based on the SXR measurement data. In some examples, SXR measurement data is employed to estimate values of shape parameters (e.g., CD, H, SWA, profile parameters, etc.) as described hereinbefore. These shape parameter values, along with the SXR measurement data, and known values of overlay error associated with in-die active device structures in close proximity to the measured DOE targets are employed to train the machine-learning based measurement models. The additional structural information improves the accuracy of the trained model.

In some embodiments, a SXR scatterometry based overlay measurement involves illuminating a sample with SXR radiation and detecting the intensities of the resulting diffraction orders for multiple angles of incidence relative to the sample, multiple wavelengths, or both. Furthermore, the overlay error associated with the measurement target is determined based on modulations in the plurality of intensities within each of the one or more nonzero diffraction orders at each of the multiple measurement instances.

Figure 7:
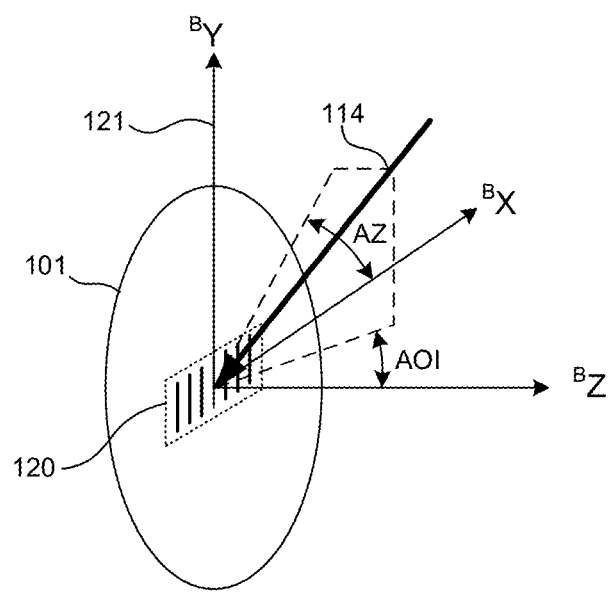
FIG. 7 is a diagram illustrative of a wafer 101 including a metrology target 120 illuminated by a beam of x-ray radiation at an angle of incidence and azimuth angle.

In these embodiments, SXR scatterometry measurements of a metrology target are performed at a number of different angles of incidence and azimuth angles. FIG. 7 depicts wafer 101 including a metrology target 120. An x-ray illumination source illuminates metrology target 120 with a beam of x-ray radiation 114 at an angle of incidence, AOI, and an azimuth angle, Az. The angle of incidence and the azimuth angle of the beam of incident x-ray radiation are defined with respect to a coordinate frame $\{^{B}X, {}^{B}Y, {}^{B}Z\}$ fixed to specimen 101. As depicted in FIG. 7, metrology target 120 includes a grating structure that extends in the $^{B}Y$ direction and is periodic in the $^{B}X$ direction. The angle of incidence is defined as the angle of the projection of the incident beam onto the $^{B}X$-$^{B}Z$ plane with respect to the $^{B}Z$ axis. In this sense, changes in the angle of incidence can be viewed as a rotation of wafer 101 about the $^{B}Y$ axis, in-plane with wafer 101. Similarly, the azimuth angle is defined as the angle of the projection of the incident beam onto the $^{B}X$-$^{B}Y$ plane with respect to the $^{B}X$ axis. In this sense, changes in the azimuth angle can be viewed as a rotation of wafer 101 about the $^{B}Z$ axis, normal to wafer 101.

As illustrated in FIG. 3, metrology tool 100 includes a specimen positioning system 140 configured to both align specimen 101 and orient specimen 101 over a large range of out of plane angular orientations with respect the SXR scatterometer. In other words, specimen positioning system 140 is configured to rotate specimen 101 over a large angular range about one or more axes of rotation aligned in-plane and normal to the surface of specimen 101. In this manner, every location on the surface of specimen 101 is available for measurement over a range of rotations about the axes of coordinate frame $\{^{B}X, {}^{B}Y, {}^{B}Z\}$ fixed to specimen 101.

In the embodiment depicted in FIG. 3, a single beam of incident x-ray radiation is illustrated. The orientation of the single beam with respect to the wafer is defined by a single nominal angle of incidence and azimuth angle. For embodiments employing a single illumination beam, x-ray diffraction measurements associated multiple, different angles of incidence and azimuth angles are performed sequentially. However, in general, x-ray diffraction measurements associated with multiple, different angles of incidence and azimuth angles may be performed simultaneously. In some embodiments, one or more x-ray sources and one or more sets of x-ray optics may be employed such that the metrology target is illuminated simultaneously from multiple directions, either discrete or continuous in angle of incidence and azimuth angle.

The vertical stacking of two or more structures in different layers of the metrology target affects the x-ray diffracted signal in a strong and unique way when measurements are made at multiple, different angles of incidence and multiple, different azimuth angles. Thus, the values of overlay and shape parameters may be estimated based on the measured intensities.

In these embodiments, the estimation of overlay involves a parameterization of the intensity modulations of common orders such that a low frequency shape modulation is described by a set, or ratio, of basis functions and a high frequency overlay modulation is described by an affine-circular function that includes a parameter indicative of the overlay.

Figure 8:
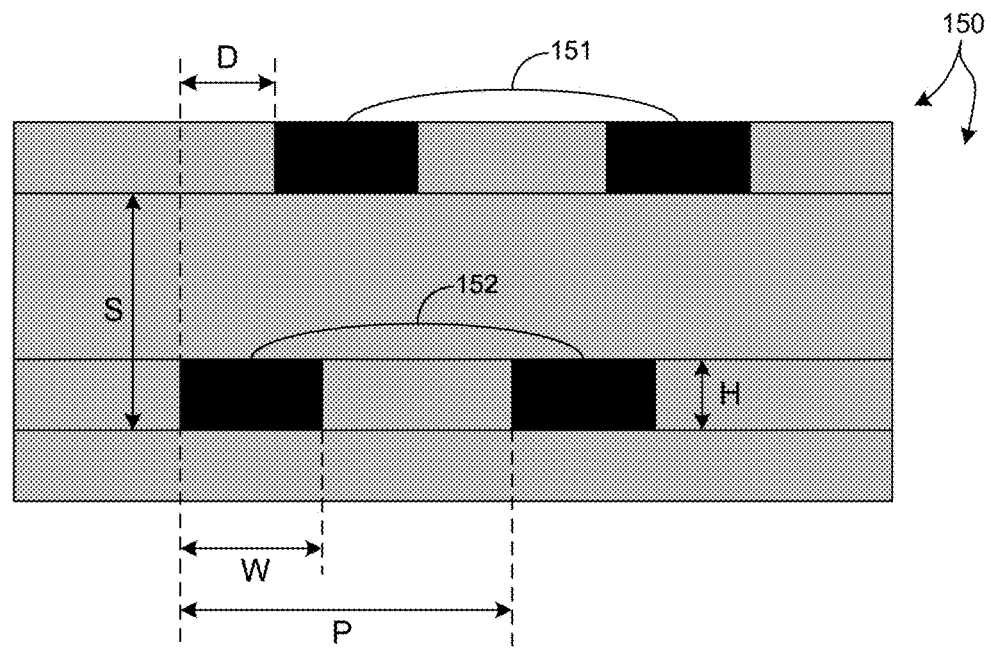
FIG. 8 depicts a layered metrology target 150 including two periodic arrays of lines 151 and 152 in different layers.

In one example, the parameterization is derived from an analysis of a canonical overlay problem. FIG. 8 depicts a layered metrology target 150 including two periodic arrays of lines 151 and 152, each having periodicity, P. The arrays of lines are separated vertically by a distance, S, and the arrays of lines are offset by overlay distance, D. The height and width of each of the arrays of lines are given by the parameters H and W, respectively.

In addition, the electron density of the top line is given by the parameter, $\delta 0$, and the bottom line by $\delta 1$. The metrology target 150 is illuminated by a beam of x-ray radiation having a wavelength, $\lambda$. The beam of incident x-ray radiation impinges on the metrology target at an angle of incidence, $\theta$, and an azimuth angle, $\varphi$, where $\varphi=0$ when the projection of the light ray is perpendicular to the periodicity of the grating. For such a grating we define the wavelength number as $k_0=2\pi/\lambda$, and the grating number in the 1D periodic direction as $k_x=2\pi/P$, where m is the order number. The angle of incidence is measured from the axis normal to the wafer.

An analysis of the diffraction intensity provides an approximation of the intensity of each order as illustrated in equation (7).

$$I = \left(\frac{k_0 WH}{P\cos\theta}\right)^2 \operatorname{sinc}\left(\frac{mk_x W}{2}\right)^2 \operatorname{sinc}\left(\frac{mk_x H \tan\theta\cos\varphi}{2}\right)^2 \left(\delta_0^2 + \delta_1^2 + 2\delta_0\delta_1\cos(mk_x(D + S\tan\theta\cos\varphi))\right) \quad (7)$$

Equation (7) illustrates that not only is there a modulation of the order intensity by changing the angle of incidence, $\theta$, but also by changing the azimuth angle, $\varphi$. Stated another way, we can expect a modulation of the diffraction orders from the projection of the grating periodic dimension aligned with $^B$X into the direction aligned with $^B$Z by changing the angle of incidence. In addition, we can expect a modulation of the diffraction orders from the projection of the grating periodic dimension aligned with $^B$X into the direction aligned with $^B$Y by changing the azimuth angle. In addition, changes in angle of incidence and azimuth angle can be coordinated to accentuate the overlay signal. For example, changing the azimuth angle can slow the shape and overlay modulation due to changes in angle of incidence by the scaling factor, $\cos(\varphi)$. Finally, equation (7) also illustrates that the modulation of the order intensity due to shape parameters W and H are typically of low spatial frequency relative to the overlay modulation described by the last term of equation (7).

Due to the relatively low spatial frequency modulation due to shape, this modulation can be modeled by a low order polynomial, e.g., a linear or quadratic function. The modulation due to separation distance, S, and overlay, D, can then be represented by the cosine term illustrated in equation (7). Hence, a simplified model of the intensity for each order takes an additive or multiplicative form as illustrated by equations (8a) and (8b), respectively.

$$I = \sum_{j=0}^{N} a_j \theta^j + b\cos(mk_x(D + S\tan\theta\cos\varphi)) \quad (8a)$$

$$I = \left(\sum_{j=0}^{N} a_j \theta^j\right)(b\cos(mk_x(D + S\tan\theta\cos\varphi))) \quad (8b)$$

The shape function defined by the first term of equation (8a) and the first factor of equation (8b) model the shape modulation as a linear combination of basis functions, $\theta j$, weighted by parameters aj, without explicit knowledge of the shape. As illustrated in equations (8a) and (8b), a monomial basis is employed to describe the shape change. However, in general, any polynomial, rational, or basis set of any kind may be employed.

The parameter, b, defines the modulation depth. Parameters D and S define the overlay. By changing the angle of incidence, azimuth angle, or both, the resulting data for any order may be fit to the parameters $a_j$, b, D, and S using any suitable curve fitting routine. The overlay is given by the fit for the parameter, D.

The simplified model for overlay measurement described hereinbefore is illustrative of a phenomenological approach to modeling the intensity variations of diffraction orders based on changes in angle of incidence and azimuth angle. In general, the model can be based on other waveforms and non-polynomial basis functions.

By fitting measured intensity signals to phenomenological, simple functions, overlay offsets associated with multiple layers may be estimated in a computationally efficient manner. As a result, the measurements are performed at a relatively low computational cost and without external reference metrology, thus overcoming the limitations of current methods based on SEM, optical metrology, or other proposed x-ray metrology techniques.

Figure 9:
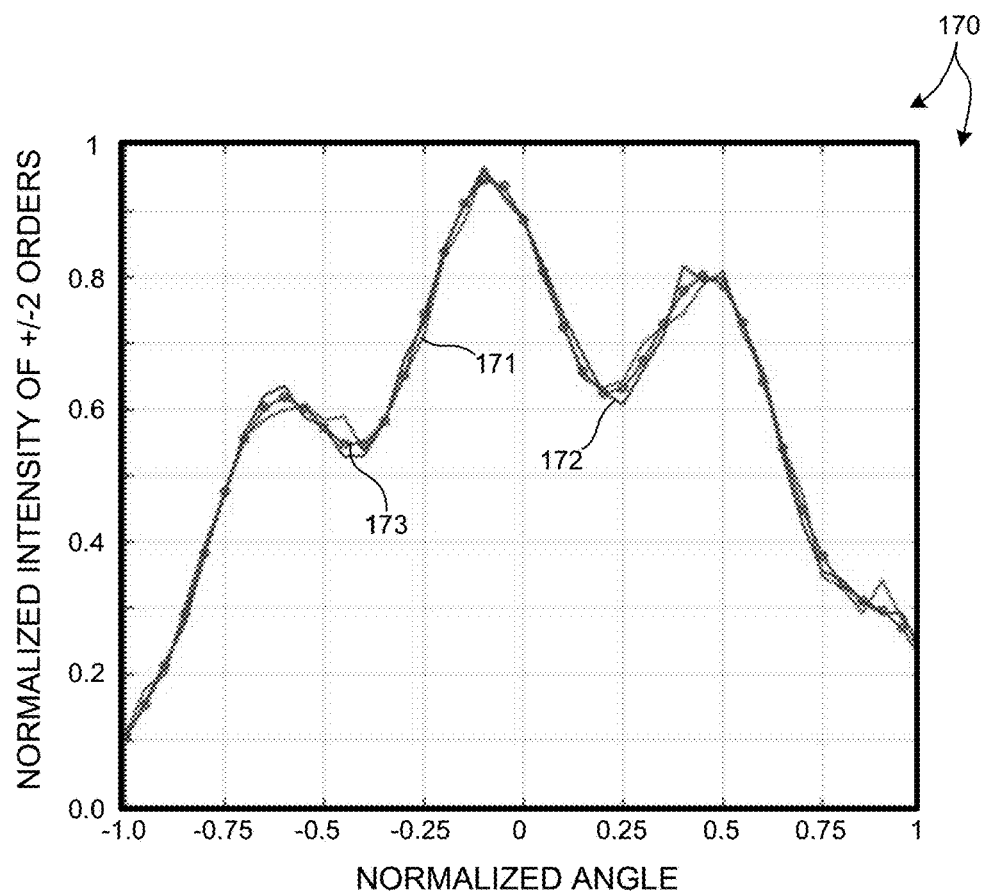
FIG. 9 depicts a plot 170 indicative of a simulation of a fitting of a simplified model of intensity and corresponding measured values of the -2 and +2 diffraction orders for a range of angles for the metrology target illustrated in FIG. 8.

FIG. 9 depicts a plot 170 indicative of simulation of the fitting results for the metrology target 150 depicted in FIG. 8. Plotline 171 depicts a simulation of the normalized intensity of the −2 diffraction order for a range of angles. Plotline 172 depicts a simulation of the normalized intensity of the +2 diffraction order for the same range of angles. Plotline 173 depicts the results of a fitting of the simulated diffraction intensities by a model of type described with reference to equation (8). As illustrated in FIG. 9, the simplified model described with reference to equation (8) provides a close fit to the simulated intensity values.

As illustrated by equation (8), the overlay modulation is an even function in the diffraction order. Thus, data from both positive and negative orders may be averaged, or fit jointly. In addition, multiple orders may be fit jointly. In some examples, different ranges in angle space may be employed for each different diffraction order. Additional details are described in WIPO Publication No. WO2016176502A1 by Hench et al., and assigned to KLA-Tencor Corporation, the content of which is incorporated herein by reference in its entirety.

In some embodiments, the actual device target is aperiodic. By calibrating overlay measurements to a reference measurement, SXR scatterometry techniques can be applied to estimate overlay of aperiodic structures based on measurements of design rule targets with sufficient periodicity. This effectively overcomes the limitation of scatterometric measurements requiring the measured target to be periodic or approximately periodic.

In some embodiments, calibrated SXR measurements are employed to estimate the overlay error associated with in-die active device structures as part of After-Develop Inspection (ADI) process monitoring. In some embodiments, the in-die active device structures are aperiodic logic devices.

In some embodiments, a single overlay error calibration value is employed to calibrate SXR scatterometry based overlay measurements. A reference metrology system, e.g., a SEM, is employed to measure overlay error associated with an in-die active device structure. In addition, a SXR scatterometry system, e.g., SXR scatterometry tool 100, is employed to measure a nearby design rule metrology target. The difference between the overlay error measured by the SXR scatterometry system and the overlay error measured by the reference metrology system is the overlay error calibration value. Subsequent overlay measurements of design rule metrology targets are adjusted by the overlay error calibration value to estimate the overlay error associated with a nearby in-die active device structure. More specifically, the overlay error calibration value is added to the overlay error measured by the SXR scatterometer to estimate the overlay error associated with the in-die active device structure. A limitation of this approach is that it does not compensate for target errors induced by the fact that the reference measurement is performed on a different target than the SXR measurements.

In one example, this limitation is overcome by feeding a SEM calibration backward to an SXR measurement of the in-die active device structure. This approach is feasible in cases where the SXR measurement does not impose any physical changes to the measured target.

In another example, two overlay error calibration values are employed to calibrate SXR scatterometry based overlay measurements. In these embodiments, a reference metrology system, e.g., a SEM, is employed to measure overlay error associated with an in-die active device structure and to measure overlay error associated with a nearby design rule metrology target. In addition, a SXR scatterometry system, e.g., SXR scatterometry tool 100, is employed to measure overlay error associated with the nearby design rule metrology target. The difference between the overlay error associated with the in-die active device structure measured by the reference metrology system and the overlay error associated with the nearby design rule metrology target is the first overlay error calibration value. The difference between the overlay error associated with the design rule target measured by the reference metrology system and the overlay error associated with the design rule target measured by SXR scatterometry system is the second overlay error calibration value. Subsequent overlay measurements of design rule metrology targets are adjusted by both the first and second overlay error calibration values to estimate the overlay error associated with a nearby in-die active device structure. More specifically, the first and second overlay error calibration values are added to the overlay error measured by the SXR scatterometer to estimate the overlay error associated with the in-die active device structure.

Reference measurements performed by a e-beam tool may be performed at high voltage, e.g., 10 kV or higher, to image one or more underlying layers. In general, the landing energy of the e-beam tool may be adjusted to maximize imaging performance.

A SXR scatterometry tool as described herein is capable of performing many different types of measurements related to semiconductor manufacturing. For example, a SXR scatterometry tool may be employed to measure characteristics of one or more targets, such as critical dimensions, overlay, sidewall angles, film thicknesses, process-related parameters (e.g., focus and/or dose), etc. The measurement targets may include regions of interest that are periodic, such as gratings in a memory die. Measurement targets may include multiple layers, and the thickness of one or more layers may be measured by a SXR scatterometry tool. Measurement targets may be located within a scribe line or located within the die itself. In some embodiments, multiple targets are measured simultaneously or sequentially by one or more metrology tools as described in U.S. Pat. No. 7,478,019, the content of which is incorporated herein by reference it its entirety. The data from such measurements may be combined and used in a semiconductor manufacturing process, for example, to feed-forward, feed-backward, and feed-sideways corrections to the process (e.g., lithography, etch).

Measurement of parameters of interest usually involves a number of algorithms. In some embodiments, the interaction of the incident beam with the sample is modeled using an electro-magnetic solver and uses such algorithms as RCWA, FEM, method of moments, surface integral method, volume integral method, FDTD, Born approximation (BA), Distorted-Wave BA (DWBA), and others. For a model-based measurement, the target of interest is usually modeled using a geometric engine, or in some cases, a process modeling engine, or a combination of both. A geometric engine is implemented, for example, in AcuShape software available from KLA Corporation (Milpitas, Calif.).

Collected data may be analyzed by a number of data fitting and optimization techniques and technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others. Collected data may also be analyzed by algorithms that do not include modeling, optimization and/or fitting to extract dimensional and material information about the structure.

In some embodiments, a multiple layer overlay metrology target is designed such that the set of separation parameters between each combination of two layers is distinct and the minimum separation distance between all layer combinations is maximized subject to a constraint on the overall height of the metrology target.

In some embodiments, a multiple layer overlay metrology target is designed with different pitch at different layers such that a diffraction order arising from one layer constructively interferes with a different diffraction order of another layer. In one embodiment, a periodic grating structure located in a first layer has a pitch equal to 2A, where A is an arbitrary, positive valued constant. Another periodic structure located in a different layer has a pitch equal to 3A. In this example, the second diffraction order of the first layer constructively interferes with the third diffraction order of the second layer. Thus, the intensity measurements detected at these order pairs are dominated by overlay between the two layers. Conversely, intensity measurements detected at different order number pairs not subject to constructive interference in overlay are dominated by shape parameters. Thus, in some embodiments, a metrology overlay target is designed with specific grating structures to increase sensitivity to overlay at specific grating order pairs, and also provide intensity data useful for estimation of shape parameter values.

Similarly, a multiple layer overlay metrology target is designed with different pitch orientations at different layers such that a diffraction order arising from one layer constructively interferes with a different diffraction order of another layer. In general, a set of layers having different periodicities (e.g., different grating pitches), different pitch orientations, or any combination thereof, gives rise to a set of scattering vectors, each associated with a different layer. The overlay metrology target is designed such that a predetermined subset of the scattering vectors are aligned. In this manner, the sensitivity to overlay among the layers corresponding with the predetermined subset of scattering vectors is enhanced.

In general, an overlay metrology target may include 1D-periodic structures, i.e., with periodicity in one direction and constant in the other, 2D periodic structures, i.e., periodic in two directions, or any combination thereof. For 2D-periodic targets, the two directions of periodicity may or may not be perpendicular to each other. Moreover, the pitch of each of the constituent structures may be the same or different.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the detector 119 and the illumination optics 115 in any manner known in the art. For example, the one or more computing systems 130 may be coupled to computing systems associated with detector 119 and the illumination optics 115, respectively. In another example, any of detector 119 and illumination optics 115 may be controlled directly by a single computer system coupled to computer system 130.

The computer system 130 may be configured to receive and/or acquire data or information from the subsystems of the system (e.g., detector 119 and illumination optics 115, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 190) via a data link. For instance, scatterometry data collected by detector 119 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, overlay values 186 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 3, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some embodiments, a scatterometry analysis as described herein is implemented as part of a fabrication process tool. Examples of fabrication process tools include, but are not limited to, lithographic exposure tools, film deposition tools, implant tools, and etch tools. In this manner, the results of a SXR scatterometry analysis are used to control a fabrication process. In one example, SXR scatterometry measurement data collected from one or more targets is sent to a fabrication process tool. The SXR scatterometry measurement data is analyzed as described herein and the results used to adjust the operation of the fabrication process tool.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, and material parameters such as electron density, composition, grain structure, morphology, stress, strain, and elemental identification.

Figure 11:
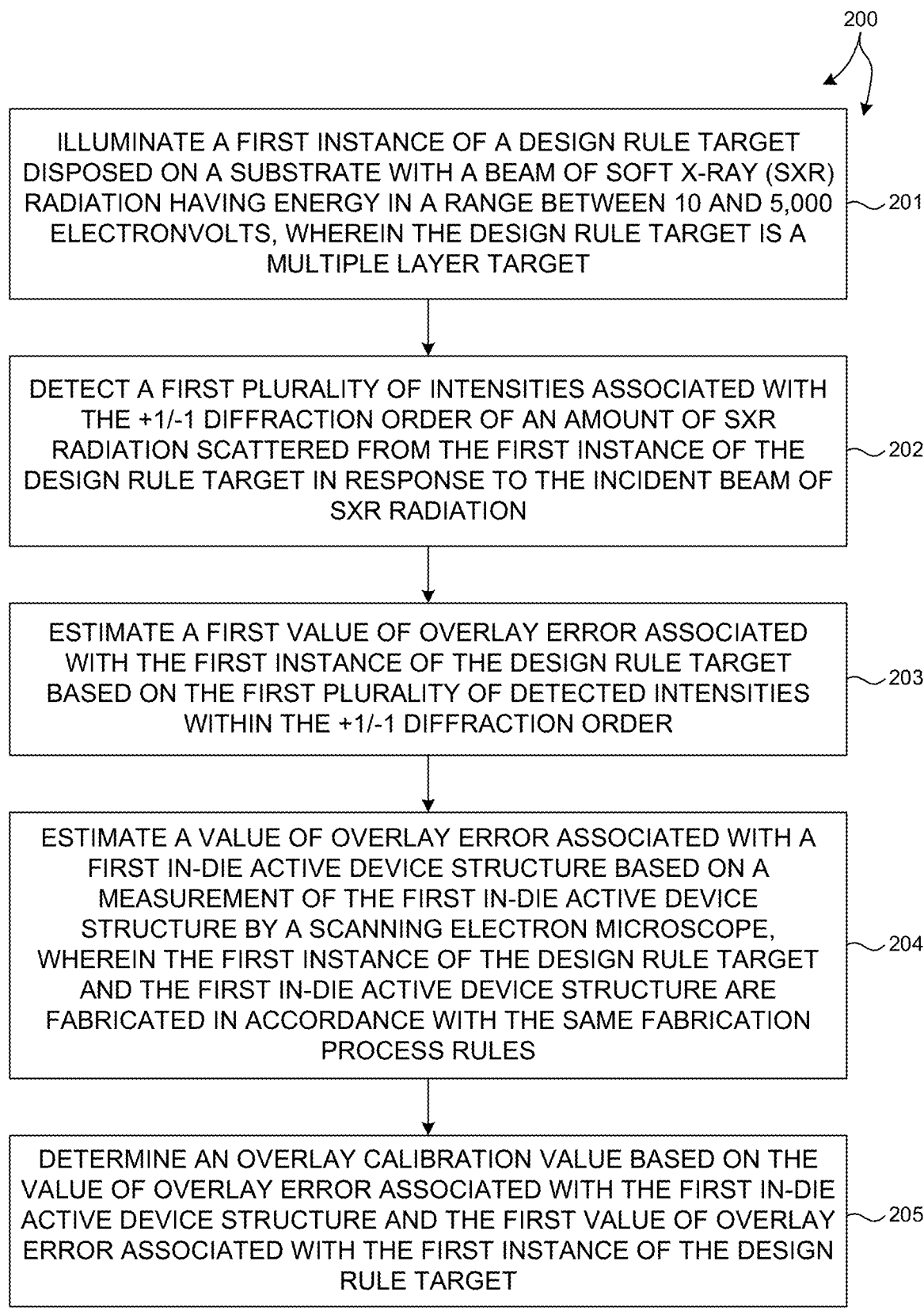
FIG. 11 is a flowchart illustrative of an exemplary method 200 of estimating overlay based on calibrated SXR measurements as described herein.

FIG. 11 illustrates a method 200 suitable for implementation by metrology system 100 of the present invention. In one aspect, it is recognized that data processing blocks of method 200 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 201, a first instance of a design rule target disposed on a substrate is illuminated with a beam of Soft X-Ray (SXR) radiation having energy in a range between 10 and 5,000 electronvolts. The design rule target is a multiple layer target;

In block 202, a first plurality of intensities associated with the +1/−1 diffraction order of an amount of SXR radiation scattered from the first instance of the design rule target is detected in response to the incident beam of SXR radiation.

In block 203, a first value of overlay error associated with the first instance of the design rule target is estimated based on the first plurality of detected intensities within the +1/−1 diffraction order.

In block 204, a value of overlay error associated with a first in-die active device structure is estimated based on a measurement of the first in-die active device structure by a scanning electron microscope. The first instance of the design rule target and the first in-die active device structure are fabricated in accordance with the same fabrication process rules.

In block 205, an overlay calibration value is determined based on the value of overlay error associated with the first in-die active device structure and the first value of overlay error associated with the first instance of the design rule target.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from imaging or structures under measurement.

Various embodiments are described herein for a semiconductor processing system (e.g., a metrology system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
 a Soft X-Ray (SXR) illumination source configured to illuminate a first instance of a measurement target disposed on a substrate with a beam of SXR radiation having energy in a range between 10 and 5,000 electronvolts, wherein the measurement target includes a first structure disposed in a first layer fabricated at a first height above the substrate and a second structure disposed in a second layer fabricated at a second height above the substrate;
 an x-ray detector configured to detect a plurality of intensities each associated with one or more nonzero diffraction orders of an amount of x-ray radiation scattered from the measurement target in response to the incident beam of x-ray radiation; and
 a computing system configured to
  estimate a value of overlay error associated with the measurement target or a corresponding in-die active device structure based on the plurality of detected intensities within each of the one or more nonzero diffraction orders.

2. The metrology system of claim 1, the x-ray detector further configured to detect an intensity associated with a zero diffraction order of the amount of x-ray radiation scattered from the measurement target in response to the incident beam of x-ray radiation, and the computing system further configured to:
 estimate a value of one or more parameters characterizing a shape of the measurement target based on the detected intensity within the zero diffraction order, the plurality of detected intensities within each of the one or more nonzero x-ray diffraction orders, or any combination thereof; and estimate a value of an edge placement error of the measurement target based on the estimated value of overlay and the estimated value of the one or more parameters characterizing the shape of the measurement target.

3. The metrology system of claim 1, the SXR illumination source further configured to illuminate a second instance of the measurement target disposed on the substrate with the beam of SXR radiation, wherein the first structure of the first instance of the measurement target is offset from the second structure of the first instance of the measurement target by an offset distance in a direction aligned with the first layer, wherein the first structure of the second instance of the measurement target is offset from the second structure of the second instance of the measurement target by the offset distance in a direction opposite the direction aligned with the first layer, the x-ray detector configured to detect a plurality of intensities each associated with one or more nonzero diffraction orders of an amount of x-ray radiation scattered from the second instance of the measurement target in response to the incident beam of x-ray radiation, and wherein the estimating of the value of overlay error associated with the measurement target is based on difference between the detected intensities within a +1 diffraction order and a −1 diffraction order associated with the first instance of the measurement target and a difference between the detected intensities within the +1 diffraction order and the −1 diffraction order associated with the second instance of the measurement target.

4. The metrology system of claim 1, wherein the estimating of the value of overlay error associated with the measurement target is based on a fitting analysis of the detected intensities within the one or more nonzero diffraction orders with a physically based measurement model.

5. The metrology system of claim 1, wherein the beam of SXR radiation is incident on the measurement target at multiple measurement instances, each at a different nominal angle of incidence, a different nominal azimuth angle, or both.

6. The metrology system of claim 5, wherein the estimating of the value of overlay error associated with the measurement target is based on modulations in the plurality of intensities within each of the one or more nonzero diffraction orders at each of the multiple measurement instances.

7. The metrology system of claim 1, wherein the value of overlay error associated with the measurement target or the corresponding in-die target is directly determined from the detected intensities within the one or more nonzero diffraction orders by a trained machine learning based measurement model.

8. The metrology system of claim 7, wherein the measurement target is not periodic.

9. The metrology system of claim 7, the Soft X-Ray (SXR) illumination source further configured to illuminate a plurality of Design Of Experiments (DOE) measurement targets with the beam of SXR radiation having energy in a range between 10 and 5,000 electronvolts, the x-ray detector further configured to detect a plurality of intensities each associated with one or more nonzero diffraction orders of an amount of x-ray radiation scattered from each of the plurality of DOE measurement targets in response to the incident beam of x-ray radiation, the computing system further configured to train the machine learning based measurement model based on the detected plurality of intensities and known values of overlay error associated with each of the DOE measurement targets or corresponding in-die targets.

10. The metrology system of claim 9, wherein the known values of overlay error are determined from measurements of the DOE measurement targets or corresponding in-die targets by a reference metrology system.

11. The metrology system of claim 1, wherein the determining of the value of overlay error associated with the corresponding in-die active device structure involves a summation of the estimated value of overlay error associated with the measurement target based on the plurality of detected intensities within each of the one or more nonzero diffraction orders and a correction value.

12. The metrology system of claim 1, wherein the first layer is a resist layer.

13. The metrology system of claim 1, wherein the measurement target is a design rule target disposed within a scribe line or an in-die active device structure.

14. The metrology system of claim 1, wherein the corresponding in-die active device structure is not periodic.

15. A method comprising:

illuminating a first instance of a design rule target disposed on a substrate with a beam of Soft X-Ray (SXR) radiation having energy in a range between 10 and 5,000 electronvolts, wherein the design rule target is a multiple layer target;

detecting a first plurality of intensities associated with the +1/−1 diffraction order of an amount of SXR radiation scattered from the first instance of the design rule target in response to the incident beam of SXR radiation;

estimating a first value of overlay error associated with the first instance of the design rule target based on the first plurality of detected intensities within the +1/−1 diffraction order;

estimating a value of overlay error associated with a first in-die active device structure based on a measurement of the first in-die active device structure by a scanning electron microscope, wherein the first instance of the design rule target and the first in-die active device structure are fabricated in accordance with the same fabrication process rules; and determining an overlay calibration value based on the value of overlay error associated with the first in-die active device structure and the first value of overlay error associated with the first instance of the design rule target.

16. The method of claim 15, further comprising:

illuminating a second instance of the design rule target with a beam of SXR radiation having energy in a range between 10 and 5,000 electronvolts;

detecting a second plurality of intensities each associated with the +1/−1 diffraction order of an amount of SXR radiation scattered from the second instance of the design rule target in response to the incident beam of SXR radiation;

estimating a value of overlay error associated with the second instance of the design rule target based on the plurality of detected intensities within the +1/−1 diffraction order;

estimating a value of overlay error associated with a second in-die active device structure based on a summation of the value of overlay error associated with the second instance of the design rule target and the overlay calibration value.

17. The method of claim 16, further comprising:
detecting an intensity associated with a zero diffraction order of the amount of x-ray radiation scattered from the second instance of the design rule target in response to the incident beam of x-ray radiation;
estimating a value of one or more parameters characterizing a shape of the design rule target based on the detected intensity within the zero diffraction order, the plurality of detected intensities within the +1/−1 diffraction order, or any combination thereof; and
estimating a value of an edge placement error of the second instance of the design rule target based on the value of overlay error associated with the second instance of the design rule target and the value of the one or more parameters characterizing the shape of the second instance of the design rule target.

18. The method of claim 15, wherein the overlay calibration value is the difference between the value of overlay error associated with the first in-die active device structure and the first value of overlay error associated with the first instance of the design rule target.

19. The method of claim 15, further comprising:
estimating a second value of overlay error associated with the first instance of the design rule target based on a measurement of the first instance of the design rule target by the scanning electron microscope, wherein the determining of the overlay calibration value is based on a difference between the first and second values of overlay error associated with the first instance of the design rule target and a difference between the value of overlay error associated with the first in-die active device structure and the second value of overlay error associated with the first instance of the design rule target.

20. The method of claim 15, wherein the design rule target is disposed within a scribe line or is an in-die active device structure.

21. The method of claim 15, wherein the in-die active device structure is not periodic.

22. A metrology system comprising:
a Soft X-Ray (SXR) illumination source configured to illuminate a first instance of a measurement target disposed on a substrate with a beam of SXR radiation having energy in a range between 10 and 5,000 electronvolts, wherein the measurement target includes a first structure disposed in a first layer fabricated at a first height above the substrate and a second structure disposed in a second layer fabricated at a second height above the substrate;
an x-ray detector configured to detect a plurality of intensities each associated with one or more nonzero diffraction orders of an amount of x-ray radiation scattered from the measurement target in response to the incident beam of x-ray radiation; and
a non-transitory, computer-readable medium storing instructions that, when executed by one or more processors, causes the one or more processors to:
estimate a value of overlay error associated with the measurement target or a corresponding in-die active device structure based on the plurality of detected intensities within each of the one or more nonzero diffraction orders.

* * * * *